(12) United States Patent
Wang

(10) Patent No.: US 6,984,587 B2
(45) Date of Patent: Jan. 10, 2006

(54) INTEGRATED POLISHING AND ELECTROLESS DEPOSITION

(75) Inventor: Yuchun Wang, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 27 days.

(21) Appl. No.: 10/753,269

(22) Filed: Jan. 8, 2004

(65) Prior Publication Data

US 2005/0153554 A1    Jul. 14, 2005

(51) Int. Cl.
*H01L 21/302* (2006.01)

(52) U.S. Cl. .................. 438/690; 438/689; 438/691; 438/692

(58) Field of Classification Search ........... 438/690, 438/694

See application file for complete search history.

(56) References Cited

U.S. PATENT DOCUMENTS

| 5,169,680 | A | 12/1992 | Ting et al. |
| 5,674,787 | A | 10/1997 | Zhao et al. |
| 6,010,962 | A | 1/2000 | Liu et al. |
| 6,140,234 | A | 10/2000 | Uzoh et al. |
| 6,350,687 | B1 | 2/2002 | Avanzino et al. |
| 6,368,484 | B1 | 4/2002 | Volant et al. |
| 6,492,266 | B1 | 12/2002 | Ngo et al. |
| 2003/0075808 | A1 * | 4/2003 | Inoue et al. ............ 257/774 |
| 2003/0190812 | A1 * | 10/2003 | Padhi et al. ............ 438/694 |

FOREIGN PATENT DOCUMENTS

| JP | 11-231925 | 2/2001 |
| WO | WO02/23613 A2 | 3/2002 |

\* cited by examiner

*Primary Examiner*—Thao P. Le

(57) ABSTRACT

The invention provides a method of modifying a substrate comprising the steps of providing a substrate comprising a base and a first metal, chemically-mechanically polishing the substrate, depositing a second metal onto the substrate, and polishing the substrate again to remove any metal overburden for a planarized surface with minimum metal loss.

27 Claims, No Drawings

INTEGRATED POLISHING AND ELECTROLESS DEPOSITION

FIELD OF THE INVENTION

The invention relates to the manufacture of semiconductor substrates and, in particular, to a method of remedying dishing which occurs during the chemical-mechanical polishing (CMP) of metal interconnections on semiconductor substrates.

BACKGROUND OF THE INVENTION

Integrated circuits are made up of millions of active devices formed in or on a semiconductor substrate, such as a silicon wafer. The active devices are chemically and physically connected to the semiconductor substrate. Different layers of the active devices are interconnected through the use of vias to form functional circuits. Typical layers of a semiconductor substrate comprise a first metal layer, an interlevel dielectric layer (ILD), and sometimes a second metal layer. Additional layers on a semiconductor substrate can be formed separately and serially. The vias between each layer are filled with metal to complete a circuit spanning more than one layer. Interlevel dielectrics, such as doped and undoped silicon dioxide ($SiO_2$) and/or low-κ dielectrics, are used to electrically isolate the different metal layers.

There are several different methods to form active devices on an ILD. In the single damascene process, a circuit design is first patterned onto the ILD. The patterned ILD comprises a series of trenches mirroring the circuit design. Then a metal film is plated over the entire patterned ILD surface to fill in the trenches which reflect the patterned circuit design. In the dual damascene process, the vias and the patterned circuit design are formed on the ILD at the same time. The resulting patterned ILD surface of vias and trenches is filled when a metal film is plated over the entire ILD.

When metal deposition is by electroplating or by an electroless process, the plating may be preceded by the deposition of a plating base or seedlayer over the entire surface of the patterned ILD. The plating base or seedlayer can be deposited by, for example, chemical vapor deposition. Various metals and alloys, such as, for example, titanium (Ti), titanium nitride (TiN), aluminum copper. (Al—Cu), aluminum silicon (Al—Si), copper (Cu), tungsten (W), platinum (Pt), ruthenium (Ru), iridium (Ir), and combinations thereof can be used to deposit a plating base or seedlayer onto the vias and trenches.

Also, barrier layers that may improve adhesion and/or prevent metal/insulator interactions or interdiffusion may be deposited between the plating base or seedlayer and the ILD. The barrier layer may be titanium (Ti), titanium nitride (TiN), titanium alloy, tantalum (Ta), tantalum nitride (TaN), tantalum alloy, tungsten (W), tungsten nitride (WN), or tungsten alloy.

Electroless plating and electroplating of Cu and Cu alloys offer the prospect of low cost, high throughput, high quality plated films and efficient via and trench filling capabilities. Electroless plating generally involves the controlled autocatalytic deposition of a continuous metal film on the semiconductor substrate surface by the interaction in solution of a metal salt and a chemical reducing agent. Electroplating comprises the electro deposition of an adherent metallic coating on an electrode employing externally supplied electrons to reduce metal ions in a plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

During the plating of metal into the trenches and vias, the narrower features become filled before their wider counterparts. For example, all features with widths less than 2 microns will be filled before those with widths greater than 5 microns. Hence, to fill trenches or vias with widths of 50 microns, the smaller trenches and vias, typically with widths less than 5 microns, are overplated. This is known in the art as metal overburden.

Once the plating of metal has been completed, the substrate surface is planarized by CMP to remove metal overburden and isolate and define the wiring pattern. CMP is becoming a more important process in the manufacture of semiconductor surfaces because more active devices are being packed into smaller areas in semiconductor substrates and because unconventional metals, such as copper, are being used in order to improve the over-all performance of the circuits. More active devices in a given area on a semiconductor substrate require better planarization techniques due to the unevenness of the topography formed by the features themselves, such as metal lines, or of the topography of the layers formed over the features. Because many layers of metals and ILDs are formed successively one on top of another, each layer needs to be planarized to a high degree if higher resolution lithographic processes are to be used to form smaller and a higher number of features on a layer in a semiconductor substrate.

CMP combines a chemical treatment of a surface layer with a mechanical removal of the chemically treated layer. Typical CMP systems contain an abrasive material, such as silica or alumina, suspended in an oxidizing, aqueous medium, which is applied to a substrate between the substrate and a polishing pad that is moved relative to the substrate to effect the polishing of the substrate.

The mechanical kinetics of CMP for a blanket deposited metal into trenches or vias in an ILD is explained by the Preston equation given by:

$$(\Delta H/\Delta t)=K_p(L/A)(\Delta s/\Delta t), \text{ where}$$

($\Delta H/\Delta t$) is the removal rate of the material in terms of change in height per unit time of polishing, and L is the load imposed over a surface area, A. ($\Delta s/\Delta t$) is the relative velocity of the pad to the substrate, and $K_p$ is Preston's coefficient. The equation predicts that, for a given (L/A), the weight loss of the polished material is proportional to the amount of travel, and it remains invariant with time. The polishing rate increases with the pressure (L/A) and velocity. In other words, the removal rate is a linear function of pressure, so that high points are polished more rapidly, and the surface quickly becomes planar.

A CMP system ideally results in a polished planar surface without residual metal films on the polished surface of the ILD, and with all of the trenches having metal at heights that are even with the level of the polished surface of the ILD. However, once the high points are quickly polished, the load is shared by lower points which are now within reach of the pad, thereby resulting in a relatively lower polishing pressure. After total removal of the metal layer from the surface of ILD, the polishing is shared between the metal layer that is level with the ILD surface and the ILD itself. Since the polishing rate of the metal is different from that of the ILD, and, in the case of copper, faster than that of the ILD, metal is removed from further below the level of the ILD, thus leaving spaces. The formation of these spaces is known in the art as dishing. This dishing in turn causes a higher pressure being built up at the edges of the trench/via openings, and therefore, erosion of the ILD edge and/or further dishing of the metal as the material of the polishing pad is subjected to elastic deformation by the ILD edge.

Severe dishing and ILD erosion in large metal features is a source of yield loss, especially when they occur at lower levels of the device, where they cause trapped metal defects in the above lying layer(s). The longer time needed to remove the thicker metal overburden on the narrowest metal trenches and vias is one of the main culprits responsible for the low throughput and yield loss in the CMP process.

Consequently, there remains a need for a method of polishing a substrate comprising a metal layer without significant dishing defects through a use of a CMP process. The invention provides such a method. These and other characteristics and advantages of the invention will be apparent from the description of the invention provided herein.

BRIEF SUMMARY OF THE INVENTION

The invention provides a method of polishing comprising (i) providing a substrate comprising a base and a first metal deposited on at least a portion of the base; (ii) providing a polishing pad; (iii) providing a first chemical-mechanical polishing composition; (iv) applying the first chemical-mechanical polishing composition to at least a portion of the substrate between the substrate and the polishing pad; (v) contacting at least a portion of the substrate with the polishing pad; (vi) moving the polishing pad relative to the substrate to polish at least a portion of the substrate; and (vii) depositing a second metal onto the substrate at a rate of about 400 Å per minute or more to form a modified substrate.

DETAILED DESCRIPTION OF THE INVENTION

The invention is directed to an integrated polishing, for example, a chemical-mechanical polishing (CMP) and electroless deposition method for use in polishing substrates such as semiconductor substrates. The polishing method comprises (i) providing a substrate comprising a base and a first metal deposited on at least a portion of the base; (ii) providing a polishing pad; (iii) providing a first chemical-mechanical polishing composition; (iv) applying the first chemical-mechanical polishing composition to at least a portion of the substrate between the substrate and the polishing pad; (v) contacting at least a portion of the substrate with the polishing pad; (vi) moving the polishing pad relative to the substrate to polish at least a portion of the substrate; and (vii) depositing a second metal onto the substrate at a rate of about 400 Å per minute or more to form a modified substrate.

The base can be any suitable base. The base can be, for example, a doped or undoped silicon dioxide ($SiO_2$). Alternatively, the base can be a multilevel base, e.g., a base with several different layers of active devices formed in or on it. The multilevel base typically will comprise two or more levels, with each level comprising a metal layer and an ILD layer, such as doped and undoped silicon dioxide ($SiO_2$) and/or low-κ dielectrics, that can be used to electrically isolate the interleaved metal layers.

The first metal can be any suitable metal. For example, the first metal can be copper, platinum, ruthenium, iridium, gold, nickel, cobalt, or combinations thereof. Preferably, the first metal is copper.

The first metal can be deposited (e.g., to form active devices) on the base by any suitable method, such as the single damascene process or the dual damascene process. In the damascene process, a circuit design is patterned onto the substrate. The circuit design can be described as a series of vias and/or trenches etched onto the surface of the substrate. After the base has been patterned with the circuit design, the first metal is plated onto at least a portion of the base, such as by electroplating or electroless deposition, to fill the vias and/or trenches of the circuit design.

Due to the varying sizes of the vias and trenches patterned onto the base, smaller vias and trenches will be filled with the first metal before the larger vias and trenches are filled with the first metal. However, the first metal must be plated until all the vias and trenches are filled. As a result, the smaller vias and trenches typically will be overfilled with the first metal when the larger vias and trenches are filled to the level of the base. Thus, the substrate comprises a base with vias and/or trenches overfilled with the first metal (i.e., a base with metal overburden).

The substrate can comprise a plating base or seedlayer deposited on at least a portion of the patterned base prior to plating the first metal thereon. The plating base or seedlayer can be deposited by chemical or physical vapor deposition. The plating base or seed layer comprises various metals and alloys, such as, for example, titanium (Ti), titanium nitride (TiN), aluminum copper (Al—Cu), aluminum silicon (Al—Si), copper (Cu), tungsten (W), platinum (Pt), ruthenium (Ru), iridium (Ir), and combinations thereof.

The substrate also can comprise a barrier layer deposited on at least a portion of the patterned base prior to plating of the first metal thereon. The barrier layer may improve adhesion and/or prevent metal/insulator interactions or interdiffusions. The barrier layer is deposited prior to the deposition of any plating base or seedlayer and is disposed between the plating base or seedlayer (if present) and the base of the substrate, usually the insulator. The barrier layer can be any suitable material. For example, the barrier layer can comprise titanium (Ti), titanium nitride (TiN), titanium alloy, tantalum (Ta), tantalum nitride (TaN), tantalum alloy, tungsten (W), tungsten nitride (WN), or tungsten alloy.

The substrate comprising the first metal deposited on at least a portion of the base is planarized by CMP to remove metal overburden and isolate and define the circuit design. To planarize the substrate by CMP, a polishing pad and a first chemical-mechanical polishing composition are provided. The polishing pad and chemical-mechanical polishing composition can be any suitable polishing pad and chemical-mechanical composition, respectively. Polishing pads and chemical-mechanical polishing compositions are well known in the art. The first chemical-mechanical polishing composition can be an electrochemical polishing composition. The first chemical-mechanical polishing composition is applied to at least a portion of the substrate between the substrate and the polishing pad. The polishing pad is then brought into contact with the substrate and the first chemical-mechanical polishing composition. The polishing pad can contact the substrate at any suitable pressure. Once in contact, the polishing pad is moved relative to the substrate at a first rotational speed to polish at least a portion of the substrate.

The first CMP typically continues until dishing occurs with respect to the first metal of the substrate. For example, the first CMP can continue until dishing of about 400 Å or more (e.g., about 500 Å or more, about 750 Å or more, about 1000 Å or more, about 1250 Å or more, or about 1500 Å or more) occurs with respect to the metal on the substrate. The amount of dishing is calculated by measuring the height of the space between the level of the substrate surface (e.g., the top surface of the insulator or the barrier layer if present) and the eroded metal surface. When a barrier layer is present on the substrate, the first CMP can remove all or part of the exposed portion of the barrier layer that is on the base but not between the first metal and the base. Typically, the first CMP will not substantially remove the exposed portion of the barrier layer that is on the base, but not between the first metal and base, especially if a second CMP process is to be carried out as described hereinafter.

Since the first CMP can continue until dishing occurs with respect to the metal, the first CMP can be done at a high first rotational speed and a high pressure. This removes the first metal at a rapid rate. The first metal can be removed at any suitable rate (e.g., about 100 nm or more per minute, about 150 nm or more per minute, about 250 nm or more per minute, about 500 nm or more per minute, or about 1000 nm or more per minute). In a preferred embodiment, during the first CMP the polishing pad is in contact with the substrate at a pressure of about 3–21 kPa (e.g., about 3–10 kPa, 8–16 kPa, or 10–21 kPa).

After planarizing the substrate by CMP, a second metal is deposited onto the substrate to form a modified substrate. The second metal desirably is selectively deposited onto areas of the substrate where the first metal remains after the first CMP. In a preferred embodiment, the selective deposition is accomplished by electroless deposition. The second metal desirably is deposited in sufficient quantity to at least compensate for any dishing with respect to the first metal so that the top surface of the second metal is at least even with the top surface of the substrate (e.g., the top surface of the insulator or the exposed barrier layer if present). Although it would be desirable for the electroless deposition to yield a planar (flat) surface (i.e., for the second metal to only compensate for the dishing with respect to the first metal), this is not usually practical to accomplish. Typically there will be some second metal overburden that desirably is subsequently removed, e.g., in a second CMP process.

Electroless deposition is the formation of a continuous metallic film on a substrate without the use of an electric current. Electroless deposition can produce films of metals, alloys, compounds, and composites on both conductive and nonconductive substrate surfaces. Film thicknesses range from $\leq 0.1$ μm to $\geq 1$ mm. Advantages of electroless deposition are the ability to produce conductive metallic films on properly prepared nonconductors and the ability to uniformly coat any platable object.

Electroless deposition requires the application of a deposition solution to the substrate. Electroless deposition typically involves the controlled autocatalytic deposition of a continuous film at a catalytic interface by the reaction of a metal salt and a chemical reducing agent in a deposition solution. The most common reducing agents are formaldehyde, hypophosphite, and organoboron compounds. The reducing agent supplies electrons to the substrate surface, where electron transfer to and reduction of the dissolved metal ions occurs. Most reducing agents, by themselves, are too slow, yielding insufficient plating rates, or too fast, resulting in bulk deposition.

A simple deposition solution of a reducing agent and metal ions is rarely satisfactory. The metal ions and reducing agent must be replenished at periodic intervals. In addition, the solution's conductivity, pH, and other conditions must be controlled. As a result, deposition solutions typically consist of a solution of a soluble metal salt, a reducing agent, a pH adjuster or buffer, a complexing agent, and one or more additives to control stability, film properties, deposition rates, etc. These additives also compensate for drag-out losses and counter bath aging effects such as total salts accumulation. Each combination of metal salt and reducing agent requires a specific pH range and deposition solution formulation.

In a preferred embodiment, the complexing agents comprise metal chelating agents or metal complexing agents, such as carboxylic acids, nitrogen-containing compounds, and phosphorus-containing compounds. In another embodiment, the deposition solution comprises $CuSO_4$, HCHO, KOH, and EDTA.

The deposition solution can have any suitable pH. The pH of the deposition solution preferably is about 7 or more (e.g., about 9 or more, about 11 or more, or even about 12 or more).

Electroless plating rates are affected by the rate of reduction of the dissolved reducing agent and the dissolved metal ions which diffuse to the catalytic surface of the object being plated. The second metal preferably is deposited onto the substrate by electroless deposition at a rate of about 400 Å per minute or more (e.g., about 500 Å per minute or more) to form a modified substrate.

Furthermore, the electroless plating rate is affected by the amount of time the deposition solution remains in contact with the substrate. The substrate can be in contact with the deposition solution for any suitable amount of time. Suitable deposition times are well known in the art. The electroless deposition preferably is performed for about five minutes or less (e.g., about 1–2 minutes, or about 1 minute or less).

The temperature at which the electroless deposition occurs also will affect the deposition rate. The deposition temperature can be any suitable temperature. The deposition temperature preferably is about 30–80° C. (e.g., about 30–45° C., about 45–55° C., or about 55–80° C.).

Because the first metal has been removed from the surface of the substrate, except in the vias and trenches, by the first CMP, the second metal will only be deposited by electroless deposition in the vias and trenches containing the first metal. The second metal can be any suitable metal. Typically, the second metal will be the same as the first metal, although the second metal can be different from the first metal. For example, the second metal can be copper, platinum, ruthenium, iridium, gold, nickel, cobalt, or combinations thereof. Preferably, the second metal is copper.

The electroless deposition may be conducted with or without the presence of the polishing pad, e.g., the polishing pad may be in contact with at least a portion of the substrate, or the polishing pad may rest above the substrate, but remain within or contact the deposition solution. The polishing pad may move relative to the substrate at a third rotational speed during the electroless deposition step. The third rotational speed may be the same or different from the first rotational speed at which the polishing pad moved relative to the substrate during the first CMP step.

It has been discovered that movement of the polishing pad relative to the substrate during the electroless deposition process improves the rate and quality of the deposition of the second metal onto the substrate. Although there is no intention of limiting the invention to the following hypothesis, it is believed that movement of the polishing pad relative to the substrate facilitates the electroless deposition of the second metal by disrupting the deposition solution so that air is displaced from the deposition solution.

The modified substrate can be planarized by a second CMP to remove the second metal overburden, e.g., to isolate and define the circuit design, and optionally to remove the exposed barrier layer if present on the modified substrate. To that end, a second chemical-mechanical polishing composition is applied to at least a portion of the modified substrate between the modified substrate and a polishing pad. The second chemical-mechanical polishing composition can be any suitable chemical-mechanical polishing composition and can be the same as or different from, preferably different from, the first chemical-mechanical polishing composition. Similarly, the polishing pad can be any suitable polishing pad and can be the same as or different from, preferably the same as, the polishing pad in the first CMP. The polishing pad then is brought into contact with the modified substrate and the second chemical-mechanical polishing composition. Once in contact, the polishing pad is moved relative to the modified substrate at a second rotational speed to polish at least a portion of the modified substrate. The second metal overburden and, if present, exposed barrier layer desirably are removed without significant dishing. While the second rotational speed can be any suitable speed, and can be the same as or different from the first and/or third rotational speeds, the second rotational speed at which the polishing pad moves relative to the substrate preferably is less than the first rotational speed.

The second metal can be removed at any suitable rate (e.g., about 250 Å or more per minute, about 300 Å or more per minute, or about 400 Å or more per minute). Typically, the removal of the second metal occurs at a rate less than the removal of the first metal. If a barrier layer is exposed on the base, the polishing of the modified substrate typically removes the exposed portion of the barrier layer that is on the base, but not between the first metal and the base. The removal rate of the second metal and barrier layer on the modified substrate preferably occurs at about the same rate. The polishing pad contacts at least a portion of the modified substrate at any suitable pressure, such as a pressure of about 3–21 kPa (e.g., about 3–10 kPa, 8–16 kPa, or 10–21 kPa).

This integrated process is particularly advantageous to remove or clear metal residue, or "puddles," from recessed areas that are often formed during multi-layer metal processing. Another advantage of the process is the potential to thicken the metal lines above the surrounding damascene base which can reduce the resistance of long metal lines. With the removal of the second metal overburden and, if present, the exposed barrier layer, the modified substrate is rendered relatively planar in a relatively short period of time. Desirably, the resulting polished modified substrate is obtained more efficiently and/or with greater planarity as compared to merely plating a metal onto a patterned base and more carefully carrying out a CMP process to remove the metal overburden without significant dishing of the metal.

EXAMPLE

This example further illustrates the invention but, of course, should not be construed as in any way limiting its scope. This example demonstrates the preparation of a semiconductor substrate in accordance with the inventive method of integrated CMP and electroless deposition.

A semiconductor substrate was provided with copper deposited in the trenches of a patterned base of an interlayer dielectric (ILD) of silicon dioxide covered with a barrier layer of tantalum. The semiconductor substrate was subjected to a conventional CMP system (Mirra® Integrated CMP System, Applied Materials, Inc., Santa Clara, Calif.) at 10.3 kPa and 63 rpm to remove the copper overburden residing on the semiconductor substrate (i.e., to remove the copper deposited outside of the trenches) without substantially removing the tantalum barrier layer. Polishing continued until dishing of the copper resulted on the surface of the substrate.

Thereafter, the semiconductor substrate was introduced to an electroless copper deposition solution comprising $CuSO_4$, HCHO, EDTA, and other additives for 1–2 minutes at 50° C. Approximately 1000 Å of copper was deposited onto the copper active devices residing on the semiconductor substrate.

The copper electroless deposition was followed by a second CMP to remove the copper overburden and the exposed tantalum barrier layer not disposed between the copper and the silicon dioxide. The second CMP utilized a CMP composition which selectively removed copper and tantalum as compared to silicon dioxide. The second CMP process removed 300 Å copper (metal), 200–400 Å tantalum (barrier layer) and 100 Å silicon dioxide (ILD). The resulting semiconductor substrate exhibited minimal dishing, metal loss, and ILD loss, in addition to a high degree of planarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of modifying a substrate comprising the steps of:
   (i) providing a substrate comprising a base and a first metal deposited on at least a portion of the base;
   (ii) providing a polishing pad;
   (iii) providing a first chemical-mechanical polishing composition;

(iv) applying the first chemical-mechanical polishing composition to at least a portion of the substrate between the substrate and the polishing pad;

(v) contacting at least a portion of the substrate with the polishing pad;

(vi) moving The polishing pad relative to the substrate to polish at least a portion of the substrate until dishing occurs with respect to the first metal; and (vii) depositing a second metal onto the substrate at a rate of about 400 Å per minute or more to form a modified substrate.

2. The method of claim 1, wherein the deposition of the second metal is electroless deposition.

3. The method of claim 2, wherein the second metal is the same as the first metal.

4. The method of claim 3, wherein the method further comprises The steps of:

(viii) providing a second chemical-mechanical polishing composition;

(ix) applying the second chemical-mechanical polishing composition to at least a portion of the modified substrate between the modified substrate and the polishing pad;

(x) contacting at least a portion of the modified substrate with the polishing pad; and (xi) moving the polishing pad relative to the modified substrate to polish at least a portion of the modified substrate.

5. The method of claim 3, wherein the first and second metals comprise copper, platinum, ruthenium, iridium, gold, nickel, cobalt or combinations thereof.

6. The method of claim 5, wherein the first and second metals are copper.

7. The method of claim 1, wherein the moving of the polishing pad relative to the substrate is continued until dishing of about 400 Å or more occurs with respect to the first metal.

8. The method of claim 7, wherein the moving of the polishing pad relative to the substrate is continued until dishing of about 1000 Å or more occurs with respect to the first metal.

9. The method of claim 4, wherein the substrate comprises silicon or an interlevel dielectric.

10. The method of claim 4, wherein the moving of the polishing pad relative to the substrate is performed at a first rotational speed, the moving of the polishing pad relative to the modified substrate is performed at a second rotational speed, and the first rotational speed is greater than the second rotational speed.

11. The method of claim 4, wherein the electroless deposition comprises the application of a deposition solution to the substrate.

12. The method of claim 11, wherein the deposition solution comprises (a) a reducing agent, (b) a metal complexing agent or a metal chelating agent, (c) a metal ion, and (d) a pH modifying reagent.

13. The method of claim 12, wherein the metal complexing agent is a carboxylic acid, nitrogen-containing compound, or phosphorous-containing compound.

14. The method of claim 11, wherein the deposition solution comprises $CuSO_4$, HCHO KOH, and EDTA.

15. The method of claim 4, wherein the electroless deposition is performed at a pH of about 7 or more.

16. The method of claim 4, wherein the electroless deposition is performed for about five minutes or less.

17. The method of claim 16, wherein the electroless deposition is performed for about two minutes or less.

18. The method of claim 4, wherein the depositing of the second metal onto the substrate by electroless deposition is performed at a rate of about 500 Å per minute or more.

19. The method of claim 4, wherein the depositing of the second metal onto the substrate is performed while the polishing pad is contacting at least a portion of the substrate.

20. The method of claim 19, wherein the depositing of the second metal onto the substrate is performed while the polishing pad is moving relative to the substrate.

21. The method of claim 1, wherein the first chemical-mechanical polishing composition is an electrochemical-mechanical polishing composition.

22. The method of claim 3, wherein the second chemical-mechanical polishing composition is an electrochemical-mechanical polishing composition.

23. The method of claim 4, wherein the substrate comprises a layer of a barrier material that is on the base and partially exposed on the surface of the base and partially disposed between the first metal and the base.

24. The method of claim 23, wherein the polishing of the substrate does not substantially remove the layer of the barrier material, and wherein the polishing of the modified substrate removes at least a portion of the second metal and the barrier material exposed on the base that is not between the first metal and the base.

25. The method of claim 24, wherein the barrier material comprises tantalum, tantalum alloys, tantalum nitride, titanium, titanium alloys, titanium nitride, tungsten, tungsten alloys, or tungsten nitride.

26. The method of claim 2, wherein the electroless deposition is performed at a temperature of about 30–80° C.

27. The method of claim 26, wherein the electroless deposition is performed at a temperature of about 45–55° C.

* * * * *